US 8,747,046 B2

(12) United States Patent
Isomura et al.

(10) Patent No.: US 8,747,046 B2
(45) Date of Patent: Jun. 10, 2014

(54) VACUUM PROCESSING APPARATUS

(75) Inventors: Ryoichi Isomura, Kudamatsu (JP); Susumu Tauchi, Shunan (JP); Hideaki Kondo, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/022,313

(22) Filed: Feb. 7, 2011

(65) Prior Publication Data

US 2012/0163943 A1    Jun. 28, 2012

(30) Foreign Application Priority Data

Dec. 28, 2010 (JP) ................................. 2010-291542

(51) Int. Cl.
*B65G 49/07* (2006.01)
*H01L 21/677* (2006.01)

(52) U.S. Cl.
USPC .......................................... 414/217; 414/939

(58) Field of Classification Search
USPC ................................................. 414/217, 939
See application file for complete search history.

(56) References Cited

U.S. PATENT DOCUMENTS

| | | | | |
|---|---|---|---|---|
| 5,067,218 A | * | 11/1991 | Williams | 29/25.01 |
| 5,286,296 A | * | 2/1994 | Sato et al. | 118/719 |
| 5,695,564 A | * | 12/1997 | Imahashi | 118/719 |
| 5,897,710 A | * | 4/1999 | Sato et al. | 427/8 |
| 7,022,613 B2 | * | 4/2006 | Pomarede et al. | 438/706 |
| 7,024,266 B2 | * | 4/2006 | Edo | 700/112 |
| 7,210,246 B2 | | 5/2007 | Van der Meulen | |
| 7,293,950 B2 | * | 11/2007 | Bonora et al. | 414/217.1 |
| 7,422,406 B2 | | 9/2008 | Van der Meulen | |
| 7,458,763 B2 | * | 12/2008 | van der Meulen | 414/805 |
| 7,769,482 B2 | * | 8/2010 | Pannese et al. | 700/121 |
| 8,029,226 B2 | * | 10/2011 | van der Meulen | 414/217 |
| 2005/0111956 A1 | | 5/2005 | Van der Meulen | |
| 2005/0113964 A1 | | 5/2005 | Van der Meulen | |
| 2005/0113976 A1 | | 5/2005 | Van der Meulen | |
| 2005/0118009 A1 | | 6/2005 | Van der Meulen | |
| 2005/0120578 A1 | | 6/2005 | Van der Meulen | |
| 2008/0138176 A1 | * | 6/2008 | Kim et al. | 414/217 |
| 2008/0274288 A1 | * | 11/2008 | Kondo et al. | 427/294 |
| 2009/0067958 A1 | | 3/2009 | Van der Meulen | |
| 2010/0189532 A1 | * | 7/2010 | Watanabe et al. | 414/217 |
| 2011/0217148 A1 | * | 9/2011 | Nakata et al. | 414/217 |
| 2012/0027542 A1 | * | 2/2012 | Isomura et al. | 414/217 |
| 2013/0183121 A1 | * | 7/2013 | Isomura et al. | 414/217 |

FOREIGN PATENT DOCUMENTS

JP         2007-511104 A        4/2007
WO    WO 2005/048313 A2    5/2005

* cited by examiner

*Primary Examiner* — James Keenan
(74) *Attorney, Agent, or Firm* — Miles & Stockbridge P.C.

(57) ABSTRACT

The vacuum processing apparatus is comprised of two vacuum transfer vessels in which a wafer is transferred through; two vacuum process vessels connected to these vacuum transfer vessels respectively; an intermediate chamber vessel capable of storing thereinto the wafer connected between the vacuum transfer vessels; a lock chamber connected to one of the vacuum transfer vessels; and a plurality of valves disposed among the vacuum transfer vessels, the vacuum process vessels, the intermediate chamber vessel, and the lock chamber respectively, for airtightly opening/closing communications among these vessels and the chamber; in which any one of the valves disposed on both sides of the intermediate chamber vessel is closed before the valves disposed between processing chambers of the vacuum process vessels and vacuum transfer chambers of the vacuum transfer vessels is opened.

4 Claims, 4 Drawing Sheets

VACUUM PROCESSING APPARATUS

BACKGROUND OF THE INVENTION

The present invention relates to a vacuum processing apparatus for processing a substrate to be processed such as a semiconductor wafer within a processing chamber disposed inside a vacuum chamber. More specifically, the present invention is directed to a vacuum processing apparatus equipped with a transfer vessel coupled to the vacuum chamber, through which the substrate to be processed is transferred.

In the above-described apparatus, more specifically, a vacuum processing apparatus for processing a substrate-shaped sample (will also be referred to as "wafer" hereinafter) such as a semiconductor wafer corresponding to a sample which should be disposed within a vacuum chamber and processed in a processing chamber decompressed, as well as finer and more precise processing, an improvement in processing efficiencies of the wafer which is an object to be processed has been required. To this end, multi-chamber apparatuses in which a plurality of vacuum chambers are coupled to a single apparatus and processings of wafers at the same time in a plurality of processing chambers is capable have been developed recently in order to improve efficiencies of productivity per foot-print areas of cleanrooms.

Also, in such an apparatus equipped with a plurality of either processing chambers or chambers for performing processes, each of either the processing chambers or the chambers constitutes each of process units in combination with means for supplying thereto an electric field or a magnetic field, exhausting means such as an exhausting pump for exhausting an inner space, means for adjusting a supply of process gas to be supplied to the inner spaces of the processing chambers, and the like. This process unit is detachably coupled to a transfer unit; the transfer unit contains a transfer room (transfer chamber) in which internal gas and its pressure thereof are adjusted to be capable of being decompressed and which is equipped with a robot arm for transferring a substrate and the like so that a wafer is internally transferred and is temporarily held. More concretely speaking, a side wall of a vacuum chamber in which either processing chambers or chambers of each of the process units are disposed, which are decompressed, is detachably coupled to a side wall of a vacuum transfer vessel of the transfer unit by which either a wafer before processing or after processing is transferred in an inner space thereof decompressed to a similar degree as that of the above-described vacuum chamber, while an inner space thereof is constructed under communicatable and closable conditions.

Within the above-described structure, an entire dimension of a vacuum processing apparatus is largely influenced by dimensions and arrangements of either vacuum transfer vessels and vacuum processing vessels or vacuum transfer chambers and vacuum process chambers. For instance, as to a vacuum transfer chamber, a dimension thereof for realizing necessary operation is determined by being further influenced based upon the number of either transfer chambers or processing chambers which are coupled adjacent thereto, the number of transfer robots disposed within the vacuum transfer chamber transferring a wafer and a minimum radius required to transfer the wafer, and a dimension of a diameter of the wafer. On the other hand, as to a vacuum processing chamber, a dimension thereof for realizing necessary operation is also influenced by a diameter of a wafer to be processed, an exhausting efficiency within processing chambers in order to realize necessary pressure, and an arrangement of appliances required for processing the wafer. In addition, the arrangements of the vacuum transfer chambers and the vacuum processing chambers are also influenced by the number of processing chambers which are required in each of processing apparatuses in order to realize a total amount and an efficiency of fabrication of semiconductor devices and the like, which are required by users at installation sites.

Moreover, there are certain possibilities that atmospheres such as process gases within the respective processing vessels of the vacuum processing apparatus may give influences with respect to other processing vessels, so that maintenance time of the apparatus is increased and the yield of products is lowered due to contamination of wafers or the apparatus. Thus, in order that the wafer is not transferred into the processing vessels under a condition that the plurality of processing vessels are specially communicated to each other at the same time, valves are provided between the processing vessels and the vacuum transfer vessels and open/close controls of the valves and pressure controls of the transfer chambers and the processing vessels are required to be performed in such a manner that the atmospheres within the processing vessels do not contact to each other. As conventional techniques for the vacuum processing apparatus for preventing the contamination with respect to the wafers and the apparatus due to the atmospheres within such vacuum processing vessels, one disclosed in JP-A-2007-511104 is known.

SUMMARY OF THE INVENTION

In the above-described conventional technique, the vacuum processing apparatus is constructed in such a manner that, either a processing chamber or a transfer chamber through which a wafer is transferred can be completely separated and made independent by valves disposed between the chamber and other processing chambers or transfer chambers when the wafers are processed or transferred by the vacuum transfer robots in either the respective processing chambers or the transfer chambers, and furthermore, pressure controls can be carried out. In the conventional technique, since such a structure is adopted, secondary contamination of the vacuum processing apparatus or the wafers due to flowing of atmospheres from the processing chambers can be prevented.

However, since the below-mentioned aspects are not sufficiently considered, the above-described conventional techniques have the following problems. That is, no sufficient consideration has been made as to such an aspect that processing efficiencies of wafers and efficiencies of productivity are optimized, and furthermore, contamination of the wafers, the vacuum processing chambers, and the vacuum transfer chambers is prevented by coupling the vacuum transfer chambers via an intermediate vessel and optimizing open/close controls of valves disposed at both end positions of the intermediate vessel. As a result, reliability of the vacuum processing apparatus is deteriorated, and the production amount and efficiency per foot-print area thereof are lowered.

For instance, when a vacuum processing apparatus is equipped with a plurality of vacuum process units, lowering of processing efficiencies is not considered in the above-described conventional technique. More specifically, in the case that these sorts of processes are sequentially performed on a wafer, in a case that different processes are performed on different wafers, or in the case where a vacuum process unit which performs either another process or a succeeding process with respect to another vacuum process unit where an arbitrary process is carried out is constructed by being coupled to another vacuum transfer vessel, a process performed in a vacuum process unit coupled to the other vacuum transfer vessel may deteriorate reliability and reproducibility as to the process performed in the vacuum process unit coupled to the other vacuum transfer vessel, and the overall process performed in the vacuum processing apparatus, so that the processing efficiencies are lowered.

An object of the present invention is to provide a vacuum processing apparatus having high reliability.

The above-described object is achieved by a vacuum processing apparatus comprising: first and second vacuum transfer vessels in which a wafer is transferred through inner decompressed vacuum transfer chambers thereof, first and second vacuum process vessels coupled to the first and second vacuum transfer vessels respectively, in which processing chambers thereof for processing therein the wafer are communicated to the vacuum transfer chambers; an intermediate chamber vessel capable of storing thereinto the wafer, which is disposed between the first and second vacuum transfer vessels by being coupled to each other by the intermediate chamber vessel; a lock chamber coupled to the first vacuum transfer vessel, the inner space of which is communicated with an inner space of the first vacuum transfer vessel; and a plurality of valves disposed among the first and second vacuum transfer vessels, the first and second vacuum process vessels, the intermediate chamber vessel, and the lock chamber respectively, for opening communications among the first/second vacuum transfer and process vessels, the intermediate chamber vessel, and the lock chamber, or for airtightly sealing the communications to close the communications; in which before the valve between the processing chamber of the first vacuum process vessel and the vacuum transfer chamber of the first vacuum transfer vessel is opened, or the valve between the processing chamber of the second vacuum process vessel and the vacuum transfer chamber of the second vacuum transfer vessel is opened, any one of the valves disposed between the first and second vacuum transfer vessels is closed.

Moreover, the above-described object is achieved by that the valves are provided between a storage chamber thereof for storing the wafer within the intermediate chamber vessel and each of the vacuum transfer chambers of the first and second vacuum transfer vessels respectively, and open, or close communications between the storage chamber and each of the vacuum transfer chambers respectively; and before the valve between the first vacuum process vessel and the first vacuum transfer vessel is opened, or the valve between the second vacuum process vessel and the second vacuum transfer vessel is opened, any one of the two valves of the intermediate chamber vessel is closed.

Furthermore, the above-described object is achieved by that the valve between the first vacuum transfer vessel and the intermediate chamber vessel, or the valve between the second vacuum transfer vessel and the intermediate chamber vessel any one of which is airtighly closed before the valve between the first vacuum process vessel and the first vacuum transfer vessel, or the valve between the second vacuum process vessel and the second vacuum transfer vessel is opened is opened after the valve between the first vacuum process vessel and the first vacuum transfer vessel, or the valve between the second vacuum process vessel and the second vacuum transfer vessel is airtightly closed.

Also, the above-described object is achieved by a vacuum processing apparatus comprising: a transfer path in which a wafer is transferred through a decompressed inner space thereof; first and second vacuum processing chambers coupled to the transfer path so as to be communicated with an inner space of the transfer path, in which the wafer is processed in decompressed inner spaces thereof; first and second valves for opening, or airtightly sealing to close communications between the first and second vacuum processing chambers and the transfer path; a third valve disposed between the first and second valves on the transfer path, for opening the transfer path, or airtightly sealing to close the transfer path; and a control unit for instructing that the third valve is airtightly closed before the first valve, or the second valve is opened.

Moreover, the above-described object is achieved by that the vacuum processing apparatus is further comprised of a fourth valve disposed between the second valve and the third valve on the transfer path, for opening the transfer path, or airtightly sealing to close the transfer path; in which the control unit instructs that any one of the third and fourth valves is airtightly closed before the first valve, or the second valve is opened.

In addition, the above-described object is achieved by that the control unit instructs that the third valve, or the fourth valve any one of which is airtightly closed before the first valve or the second valve is opened is opened after the first valve, or the second valve is airtightly closed.

Other objects, features and advantages of the invention will become apparent from the following description of the embodiments of the invention taken in conjunction with the accompanying drawings.

DESCRIPTION OF THE EMBODIMENTS

Referring now to drawings, a detailed description is given below to explain an embodiment of a vacuum processing apparatus according to the present invention.

Figure 1:
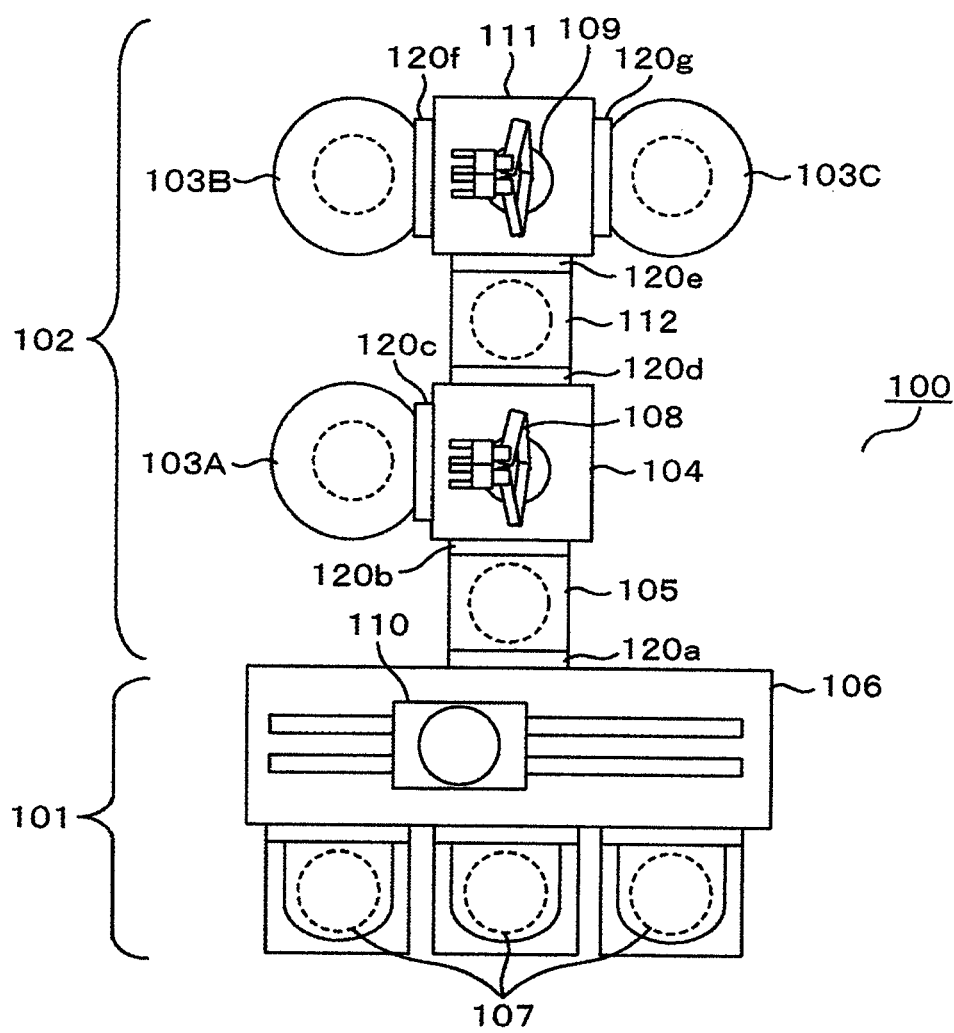
FIG. 1 is an upper view for explaining an outline of an overall structure of a vacuum processing apparatus according to an embodiment of the present invention.

An embodiment of the present invention is described with reference to FIG. 1 to FIG. 4. FIG. 1 is an upper view for explaining an outline of an overall structure of a vacuum processing apparatus according to the embodiment of the present invention.

A vacuum processing apparatus 100 containing a vacuum processing chamber according to the embodiment of the present invention and shown in FIG. 1 is mainly arranged by an atmosphere-side block 101 and a vacuum-side block 102. The atmosphere-side block 101 is a block for transferring and determining a storage position of a substrate-shaped sample such as a semiconductor wafer, which is a subject to be processed by the vacuum processing apparatus 100, under atmospheric pressure. The vacuum-side block 102 is a block for transferring the substrate-shaped sample such as the wafer and for performing a process within a processing chamber arranged within a predetermined vacuum process unit under pressure decompressed from the atmospheric pressure.

Then, between the atmosphere-side block 101 and a portion of the vacuum-side block 102 for performing the above-described sample transfer and process a portion coupling the block 101 to the portion of the block 102 is arranged which increases/decreases pressure between the atmospheric pressure and the vacuum pressure under a condition that the sample is internally provided. In the vacuum processing apparatus 100 related to the present embodiment, a time length during which the sample is stayed in the vacuum-side block 102 is longer than a time length during which the sample is stayed in the atmosphere-side block 101.

Furthermore, a time length during which the sample is transferred in both the vacuum-side block 102 and the atmosphere-side block 101 is longer than a time length during which the sample is processed under a condition that the sample is arranged inside a vacuum processing chamber; more specifically, a time length during which the sample is processed inside a vacuum processing chamber is shorter than a time length required to transfer the sample within the vacuum-side block 102. When either plural pieces or plural lots of samples are processed in such a vacuum processing apparatus 100, time required for transferring the sample dominantly gives an influence to a total processing number per unit time.

The atmosphere-side block 101 has a housing 106 having a substantially rectangular shape, which is internally equipped with an atmospheric transfer robot 110, while a plurality of cassette stages 107 are equipped on the front side of this housing 106; cassettes into which substrate-shaped samples (will be referred to as "wafers" hereinafter) such as semiconductor wafers of processing-purpose or cleaning-purpose subjects to be processed have been stored are mounted on the cassette stages 107. The front side of the housing 106 is a portion faced to a path through which the cassettes are transferred by a transfer robot (not shown) in a state that either unprocessed or processed samples have been stored in the cassettes within a building such as a cleanroom where the vacuum processing apparatus 100 is installed. In other words, the atmosphere-side block 101 is arranged on the front side of the vacuum processing apparatus 100, and the cassette stages 107 are arranged to be faced with the path of the cassettes.

The vacuum-side block 102 is provided with first/second vacuum transfer chambers 104/111 and one or a plurality of a lock chamber 105. The lock chamber 105 is arranged between the atmosphere-side block 101 and first/second vacuum transfer chambers 104/111, in which samples to be processed are transferred through decompressed inner spaces thereof between vacuum processing chambers. In the lock chamber 105 pressure is changed between the atmospheric pressure and the vacuum pressure while a wafer is internally present which is delivered between the atmosphere-side and the vacuum-side. An inner space of the lock chamber 105 of the present embodiment is communicated to an entrance of a vacuum exhausting apparatus (not shown) such as a rotary pump. The lock chamber 105 is constructed, the pressure of which is adjustable to be the above-described pressure by operation of the vacuum exhausting apparatus. Holding units capable of holding a plurality of wafers by making gaps along upper/lower directions among planes of the wafers under stored conditions are arranged inside the lock chamber 105 and can hold these wafers in such a manner that unprocessed wafers are stored in an upper holding unit and processed wafers are stored in a lower holding unit.

The lock chamber 105 in the present embodiment is a vacuum chamber capable of decompressing pressure down to a degree of vacuum of the inner space of the vacuum-side block 102, and of increasing the pressure from this degree of vacuum up to pressure of the inner space of the housing 106, for instance, the atmospheric pressure around the vacuum processing apparatus 100. In the lock chamber 105, a path through which wafers pass to be transferred, and valves 120a and 120b capable of opening and closing this path so as to seal airtightly are disposed at predetermined places of the housing 106 and a side coupled to the first vacuum transfer chamber 104 which is arranged on the back side of the housing 106, and a space between the atmosphere side and the vacuum side is airtightly divided. Also, storage units capable of storing/holding a plurality of wafers by making gaps along the upper/lower directions are equipped in the inner space of the lock chamber 105 and the space is airtightly divided by closing the valves 120a and 120b under the condition that these wafers have been stored in the storage units.

The first vacuum transfer chamber 104 and the second vacuum transfer chamber 111 are units containing vacuum chambers, the planar shape of which is substantially rectangular, and are two units having structural differences which can be regarded as an essentially same structure. Each of these units is internally equipped with a processing chamber which is decompressed down to a predetermined degree of vacuum within each vessel and a transfer robot which mounts a wafer at a predetermined position on an arm thereof and transfers the wafer in an inner space of each processing chamber.

A vacuum transfer intermediate chamber 112 is a vacuum vessel capable of decompressing pressure of an inner space thereof down to a degree of vacuum equivalent to that of either another vacuum transfer chamber or a vacuum processing chamber and couples the vacuum transfer chambers with each other, so that inner chambers thereof are communicated. Valves 120d and 120e are disposed between the vacuum transfer intermediate chamber 112 and the vacuum transfer chambers and the valves open or divide to cut off a path for communicating the inner chambers, through which a wafer is internally transferred. By closing these valves 120d and 120e the vacuum transfer intermediate chamber 112 and either the first vacuum transfer chamber 104 or the second vacuum transfer chamber 111 is airtightly sealed and an inner space of the vacuum transfer intermediate chamber 112 is airtightly sectioned with respect to these chambers.

Also, in the inner chamber of the vacuum transfer intermediate chamber 112, a storage unit is disposed which mounts a plurality of wafers by making gaps among planes of these wafers so as to horizontally hold these wafers. The vacuum transfer intermediate chamber 112 has a function of a relaying chamber by storing wafers once when the wafers are delivered between the first and second vacuum transfer chambers 104 and 111 or a function of a waiting chamber by bringing these wafers into a waiting condition until the wafers are transferred out from the inner space of the vacuum transfer intermediate chamber 112 to a next chamber (either a processing chamber in a vacuum process unit or the lock chamber 105). In other words, a wafer which is transferred in and is mounted on the above-explained storage unit by any one of vacuum transfer robots 108 and 109 employed in one of the vacuum transfer chambers is transferred out by any one of the vacuum transfer robots 108 and 109 employed in the other of these vacuum transfer chambers to be transferred into any one of vacuum process units 103A through 103C or the lock chamber 105, which is coupled to the last-mentioned vacuum transfer chamber.

The vacuum transfer intermediate chamber 112 is disposed between side walls corresponding to one planes located on opposite planes where the first vacuum transfer chamber 104 is faced with the second vacuum transfer chamber 111, whose planar shapes are rectangular, so as to couple the vacuum transfer chambers to each other. Furthermore, the vacuum process units 103A to 103C whose inner spaces are decompressed and through which wafers are internally transferred to be processed are connected to at least any one plane of other planes. In the present embodiment, the vacuum process units 103A to 103C indicate an overall unit which includes electric field/magnetic field generating means constructed by containing vacuum chambers and decompressing means containing vacuum pumps for exhausting processing chambers corresponding to spaces to be decompressed within the vessels. In the internal processing chambers, an etching process, an ashing process, or another process executed for semiconductor wafers are carried out. Also, to the respective vacuum process units 103A to 103C pipes are connected through which process gases flow, which are supplied in response to a process to be executed.

Although two pieces of vacuum process units are capable of being coupled to the first vacuum transfer chamber 104, one piece of the vacuum process unit 103A is coupled thereto in the present embodiment. On the other hand, although three pieces of vacuum process units are capable of being coupled to the second vacuum transfer chamber 111, two pieces of the vacuum process units 103B and 103C are coupled thereto in the present embodiment.

The first vacuum transfer chamber 104 and the second vacuum transfer chamber 111 are constructed therein as transfer chambers which are decompressed by being coupled to vacuum exhausting pumps. In the first vacuum transfer chamber 104, the first vacuum transfer robot 108 is disposed at a center portion of the inner space thereof, which transfers a wafer between the lock chamber 105 and any one of the vacuum process unit and the vacuum transfer intermediate chamber 112 under vacuum of a predetermined degree of pressure. The second vacuum transfer robot 109 is similarly disposed at a center portion of the inner space of the second vacuum transfer chamber 111 and transfers a wafer among any one of the vacuum process units and the vacuum transfer intermediate chamber 112.

In the present embodiment, while the respective structural elements of these vacuum transfer robots 108 and 109 are identical to each other including shapes, quantities, arrangements, and operating directions of arms thereof and for the sake of convenience these transfer robots are discriminated as the first vacuum transfer robot 108 and the second vacuum transfer robot 109 here. The above-described vacuum transfer robots 108 and 109 mount wafers on predetermined mounting planes located on the arms thereof and in the first vacuum transfer chamber 104 a wafer is transferred in and out between a wafer stage disposed in the vacuum process unit and either the lock chamber 105 or the vacuum transfer intermediate chamber 112. Paths through which the wafers internally pass and are transferred are provided among the vacuum process units 103A to 103C, the lock chamber 105, the vacuum transfer intermediate chamber 112, and the transfer chambers of the first vacuum transfer chamber 104 and the second vacuum transfer chamber 111 and communications of these paths are cut/connected by valves 120a through 120g which can be airtightly closed and opened.

Moreover, although not shown in the drawing, vacuum exhausting pumps such as turbo-molecular pumps or rotary pumps are coupled to the respective vacuum process units 103A to 103C, and the first and second vacuum transfer chambers 104 and 111 and exhaust the inner spaces thereof so as to decompress the inner spaces while exhaust ports communicated to entrance ports of the vacuum exhausting pumps are disposed in these inner portions. Also, the vacuum exhausting pumps may be coupled to the first and second vacuum transfer chambers 104 and 111 respectively. Alternatively, the vacuum transfer chambers 104 and 111 may be commonly exhausted by providing exhausting paths which communicate an entrance port of a common vacuum exhausting pump with the respective exhausting ports while exhausting amounts and cutting/connecting of exhausting operations may be controlled by the respective valves disposed on the respective paths.

On the other hand, in the present embodiment, while exhausting means such as a vacuum exhausting pump independently exhausts the inner space thereof with respect to inner spaces of other chambers is not coupled via an exhausting port to the vacuum transfer intermediate chamber 112; an inner portion of the vacuum transfer intermediate chamber 111 is constructed to be exhausted and decompressed via the first and second vacuum chambers 104 and 111 communicated therewith, the inner processing chambers of the respective vacuum process units 103A to 103C, or the lock chamber 105. In the above-described construction of the present embodiment, any one of the gate valves 120d and 102e is constructed to be opened so as to exhaust an inner space, while the gate valves 102d and 120e open/close paths (gates) through which a wafer is internally transferred, which are disposed at end portions of the vacuum transfer intermediate chamber 112 along upper/lower directions viewed on the drawing (front/back directions of vacuum processing apparatus 100).

In the present embodiment, a wafer mounted on a wafer supporting portion of an arm tip portion of the atmospheric transfer robot 110 is adsorbed/held on the wafer supporting portion by an adsorbing apparatus disposed on a wafer contact surface of the wafer supporting portion and an occurrence of positional shifts of the wafer on the wafer supporting portion due to operation of the arm is suppressed. More specifically, it is equipped with such a structure that the wafer is adsorbed to the contact surface with lowering pressure by sucking surrounding gases from a plurality of openings provided on the contact surface of the wafer supporting portion.

On the other hand, instead of adsorption executed by suction, on the wafer supporting portions of the arm tip portions, on which the wafers are mounted by the first vacuum transfer robot 108 and the second vacuum transfer robot 109, convexs, projections, and pins are disposed to suppress positional shifts by being contacted to wafers on the wafer supporting portions, by which the positional shifts of the wafers due to operations of the arms are suppressed. Also, in order to suppress such positional shifts, either operating speeds of the arms or ratios of changes in the speeds (acceleration) are suppressed. As a result, in order to transfer a wafer over the same distance, the first vacuum transfer robot 108 and the second vacuum transfer robot 109 take longer time than that by the atmospheric transfer robot 110, so that an efficiency of the wafer transfer in the vacuum-side block 102 is lower than that in the atmosphere-side block 101.

Each of the first vacuum transfer robot 108 and the second vacuum transfer robot 109 of this embodiment is equipped with a first arm and a second arm, respectively, which are constructed of small arms coupled to each other by a plurality of joint portions and can be operated by being independently driven while mounting thereon wafers. Each of the first and second arms is coupled to a base portion which is disposed on a center portion within the respective transfer chambers along the upper/lower directions (paper plane direction viewed on the drawing) and are rotatable around an axis and these first and second arms are rotary-driven to be directed with respect to either the vacuum process units 103A to 103C, the vacuum transfer intermediate chamber 112, or the lock chamber 102, which constitutes a target; and the respective small arms are rotated around the joint portions so as to be extended, or contracted, so that the wafers mounted on the tip portions of the first and second arms are transferred. Also, the first and second arms are constructed so as to be capable of performing a replacing operation as follows. That is, after one of these two arms is caused to approach with respect to the target in order to mount thereon one wafer and is contracted, another wafer mounted on the other arm is continuously caused to proceed into the target so as to deliver it to the target, so that two different wafers can be replaced by each other with respect to the target.

The respective structural portions which constitute the above-described atmosphere-side block 101 and vacuum-side block 102 of the vacuum processing apparatus 100 of the present embodiment are coupled via communication means with a control unit (not shown) in a communicatable manner. The control unit receives output from sensors for sensing operations of the respective portions and transmits signals calculated by an internal calculator so as to instruct operations to the respective portions through the above-described communication means with respect to the respective portions.

The control unit is equipped with the calculator for calculating the above-described instructions or for selecting information of instructions from internally stored information, a storage apparatus for storing thereinto programs in which calculations or operations of the respective portions have been described and data, and an input/output interface for receiving the above-described information and signals, and also, the signals from the sensors arranged in the respective portions for sensing situations of operations while these are coupled to each other by the communication means in the communicatable manner. Alternatively, the control unit may be arranged with a host computer in a communicatable manner, which controls transferring operations of cassettes where wafers are stored in a building such as a cleanroom in which the vacuum processing apparatus 100 is installed, so that the control unit selects or sets the signals to transmit to the respective portions based upon signals from the host computer for instructing the operations or the control unit may transmit the above-explained signals received from the sensors of the respective portions of the vacuum processing apparatus 100 to the host computer.

In the below-mentioned present embodiment, under a condition that the transfer time within the vacuum-side block 102 is long compared with that within the atmosphere-side block 101, a case capable of reducing transfer times during which wafers are transferred on the transfer paths via the vacuum transfer chambers, the intermediate chamber, and the vacuum processing chambers constituting these blocks so as to improve a processing efficiency is exemplified. Moreover, an example is shown which reduces such an event that an atmosphere such as a process gas used when a wafer is processed in each of the vacuum process units enters into other vacuum process units or becomes in contact with an atmosphere such as a process gas used when the wafer is processed in other vacuum process units (will be referred to as "contamination" hereinafter). Also, times during which the wafers are processed in the respective vacuum process units are similar or shorter than these wafer transfer times and the transfer times may give a larger influence or, in particular, may give a dominant influence to a total number of processing the wafers per unit time in the entire vacuum processing apparatus 100.

Next, a description is made of operations for processing wafers in the above-described vacuum processing apparatus 100.

Upon receipt of either an instruction from the control unit, or an instruction from a control apparatus such as a host computer of a fabrication line where the vacuum processing apparatus 100 is installed, processes for a plurality of wafers are commenced which are stored in the cassettes mounted on any one of the cassette stages 107. For instance, upon receipt of the instruction from the control unit, the atmospheric transfer robot 110 derives a specific wafer stored in a cassette from a cassette, and transfers the derived wafer to the lock chamber 105. In this case, in a positioning apparatus disposed inside the housing 106 or communicated with a transfer chamber in which a down flow is formed, after a direction of a specific place around a center of the derived wafer may be positioned, the resulting wafer may be alternatively transferred to the lock chamber 105.

In the lock chamber 105 into which the wafer is transferred and stored, the valve 102a for opening/closing the space between the lock chamber 105 and the transfer chamber in the housing 106 is closed on the side facing to the transfer chamber within the housing 106 with the transferred wafer being stored. When the valve 120b disposed at the end portion on the side of the first vacuum transfer chamber 104 under this condition is airtightly closed, then the inner space of the lock chamber 105 is airtightly closed, and is decompressed down to predetermined pressure while this airtightly closed condition is maintained. After the inner space is exhausted by the above-described exhausting means to be decompressed down to a degree of vacuum equivalent to that of the transfer chamber within the first vacuum transfer chamber 104, the valve 120b disposed on an end portion of the lock chamber 105 on the side faced to the first vacuum chamber 104 for opening/closing the gate is opened so that the lock chamber 105 and the transfer chamber inside the first vacuum transfer chamber 104 are communicated.

The first vacuum transfer robot 108 is rotary-driven by a predetermined angle around the axis of the center portion to locate the tip portion of one of the arms facing to the lock chamber 105 and the arm thereof is extended to be entered into the lock chamber 105 to receive the wafer within the lock chamber 105 on the wafer supporting portion of the tip portion of the arm and to take it into the first vacuum transfer chamber 104 (transfer out). Furthermore, the first vacuum transfer robot 108 transfers the wafer mounted on the arm into any one of the vacuum process unit 103A and the vacuum transfer intermediate chamber 112, which are connected to the first vacuum chamber 104, along a transfer path which has been previously designated by the control unit when this wafer is taken out from the cassette. For instance, the wafer transferred into the vacuum transfer intermediate chamber 112 is thereafter transferred out from this vacuum transfer intermediate chamber 112 to the second vacuum transfer chamber 111 by the second vacuum transfer robot 109 provided in the second vacuum transfer chamber 111, and then, is transferred into any one of the vacuum process units 103B and 103C, which corresponds to a target place of the previously determined transfer path.

After the wafer is transferred to any one of the vacuum process units, which is designated as the target, any one of the valves 120c, 120f, 120g for opening/closing between this vacuum process unit and either the first vacuum transfer chamber 104 or the second vacuum transfer chamber 111, which is connected thereto, is closed so that the processing chamber within the relevant vacuum process unit is airtightly sealed with respect to the transfer chamber. Thereafter, a process gas is introduced to this processing chamber, so that pressure of the inner space of this processing chamber is adjusted to become pressure suitable for a process. Either an electric field or a magnetic field is applied to the relevant processing chamber from either an electric field generating unit or a magnetic field generating unit, which is installed above the relevant vacuum process unit, and the process gas is excited by the electric field or the magnetic field so that plasma is produced within this processing chamber and the wafer is processed by the plasma.

In the present embodiment, each of the valves 120c, 120f, and 120g for opening/closing between the relevant vacuum process unit where the wafer is processed and the vacuum transfer chambers coupled thereto is opened in response to an instruction from the control unit under such a condition that other valves among the valves 120a to 120g have been closed which can open/close the spaces containing the relevant vacuum transfer chamber and coupled to communicate thereto. For example, before the valve 120f is opened which sections the space between the vacuum process unit 103B and the second vacuum transfer chamber 111 coupled thereto, the control unit issues either a closing instruction or a conforming instruction of the closing operation of the valve 120g which open/close the gate disposed on the path formed by communicating the respective processing chambers with the second vacuum transfer chamber 111, through which the wafer is internally transferred, in order that the processing chamber within this vacuum process unit 103B is not communicated with the processing chamber within another vacuum process unit 103C; after the closing operation is detected or confirmed, the control unit issues an instruction for opening the valve 120f which has airtightly sealed the vacuum process unit 103B.

When a detection is made that the wafer has been transferred out into the second vacuum transfer chamber 111, after a confirmation is made that the valves 120f and 120g between the vacuum process units 103B, 103C, and the second vacuum transfer chamber 111 are closed and airtightly sealed, the second vacuum transfer robot 109 transfers in and delivers the processed wafer into any one portion of the upper/lower portions of the wafer holding unit corresponding to a station within the vacuum transfer chamber 112. Thereafter, a detection is made that the inside of the first vacuum transfer chamber 104 is airtightly sealed; the valve 120d for opening/closing between the first vacuum transfer chamber 104 and the vacuum transfer intermediate chamber 112 is opened in response to an instruction from the control unit. The first vacuum transfer robot 108 transfers out the processed wafer held in the wafer holding unit within the vacuum transfer intermediate chamber 112 into the inside of the first vacuum transfer chamber 104 and transfers this processed wafer to the inside of the lock chamber 105 via a transfer path opposite to that in the case that this wafer is transferred into the inside of the first vacuum transfer chamber 104.

Once the processed wafer is transferred to the lock chamber 105, the valve 120b is closed which opens/closes the path for communicating the lock chamber 105 and the transfer chamber of the first vacuum transfer chamber 104 and the pressure in the lock chamber 105 is increased from pressure (vacuum pressure) of the degree of vacuum which is equivalent to that in the first vacuum transfer chamber 104 up to the atmospheric pressure in a reverse manner to that when this wafer is transferred thereinto. Thereafter, when the pressure is confirmed, in response to an instruction from the control unit, the valve 120a for sectioning the space between the inside of the housing 106 and the inside of the lock chamber 105 is opened so that the inside of the lock chamber 105 and the inside of the housing 106 are communicated The atmospheric transfer robot 110 takes out the processed wafer from the inside of the lock chamber 105, transfers this processed wafer to the original cassette, and returns it by mounting it on the original position within the cassette.

The above-described operation is repeatedly carried out on every wafer stored in the cassettes until the previously designated number of wafers or unprocessed wafers stored in the cassettes are depleted; namely, such an operation that each of the wafers is on the similarly and previously designated transfer path taken out from a cassette, transferred in, transferred out after being processed, and returned to the original position of the original cassette with respect to the vacuum process units 103A to 103C designated from either the control unit or the host computer. When a detection is made that processes for the respective wafers of the predetermined cassettes are accomplished and all the processed wafers are returned to the cassettes, the host computer which receives a signal from the control unit instructs the control unit to transfer another cassette which has stored thereinto an unprocessed wafer or to perform a process of an unprocessed wafer stored in another cassette on the cassette stage 107, so that the processing operation is continuously carried out. Otherwise, when either the control unit or the host computer detects that in at least one of the vacuum process units 103A to 103C, a predetermined number of wafer processing or an accumulation time of processes has reached a predetermined value, a signal for instructing maintenance operation of the relevant vacuum process unit is transmitted from at least any one of these control unit and host computer, so that driving and operating of this vacuum process unit or the entire vacuum processing apparatus 100 for processing the wafers are stopped and the maintenance and checkout are performed. Alternatively, in order to notify to a user that the above-described maintenance and checkout should be carried out, maintenance/checking operations may be notified or a need/or not for the maintenance/checking operations may be notified on a display means such as a monitor installed to be communicatable with the control unit.

Figure 2:
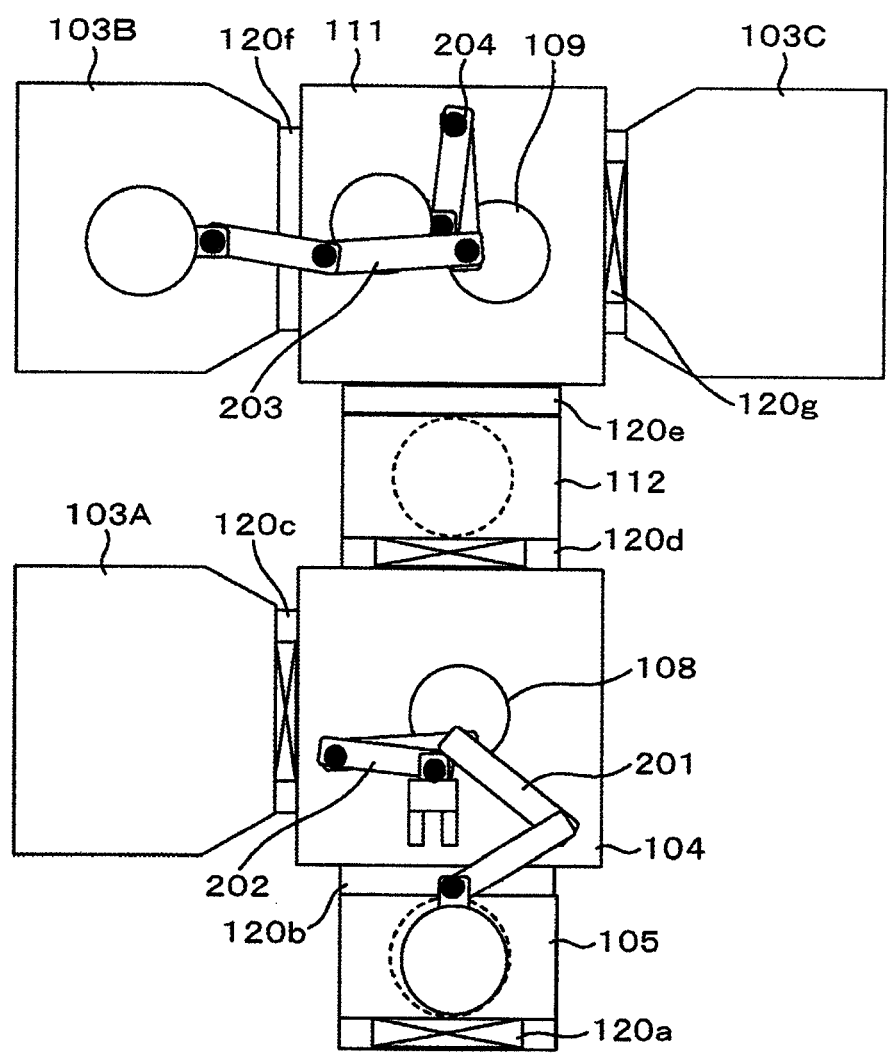
FIG. 2 is a cross-sectional view for indicating vacuum transfer chambers of the embodiment shown in FIG. 1 in an enlarging manner.
Figure 3:
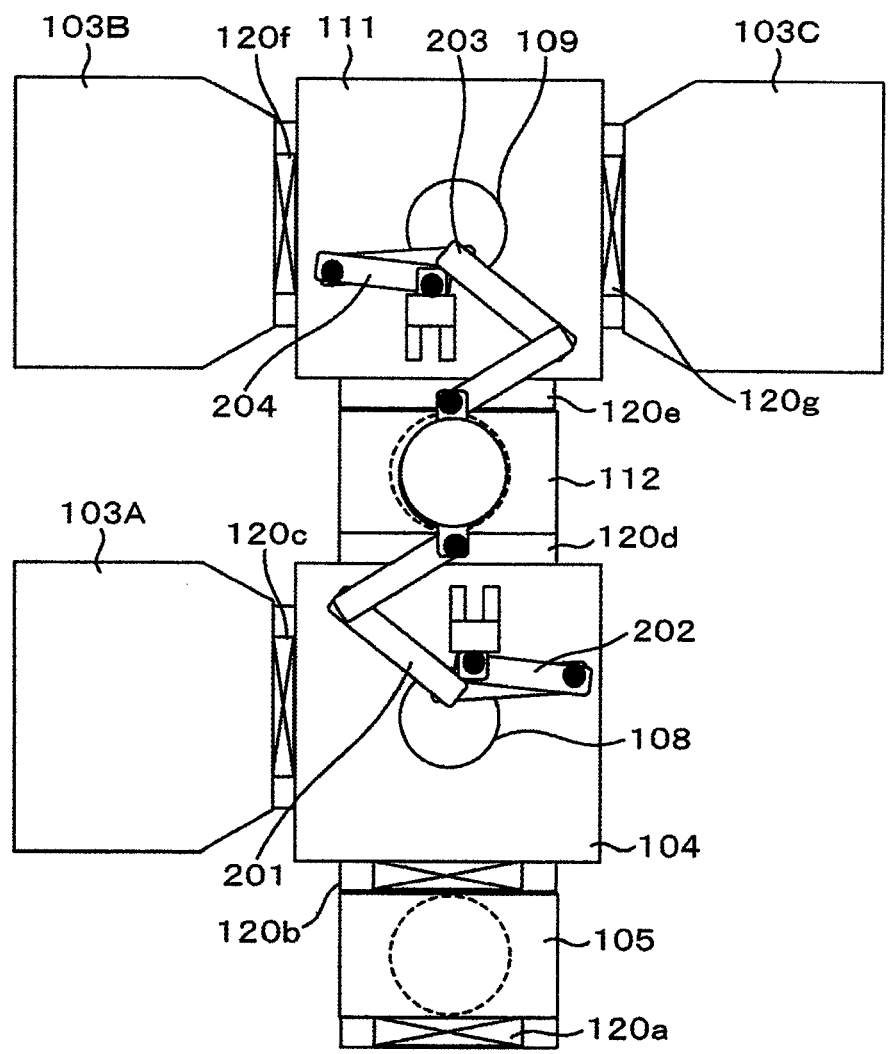
FIG. 3 is a cross-sectional view for indicating the vacuum transfer chambers of the embodiment shown in FIG. 1 in the enlarging manner.
Figure 4:
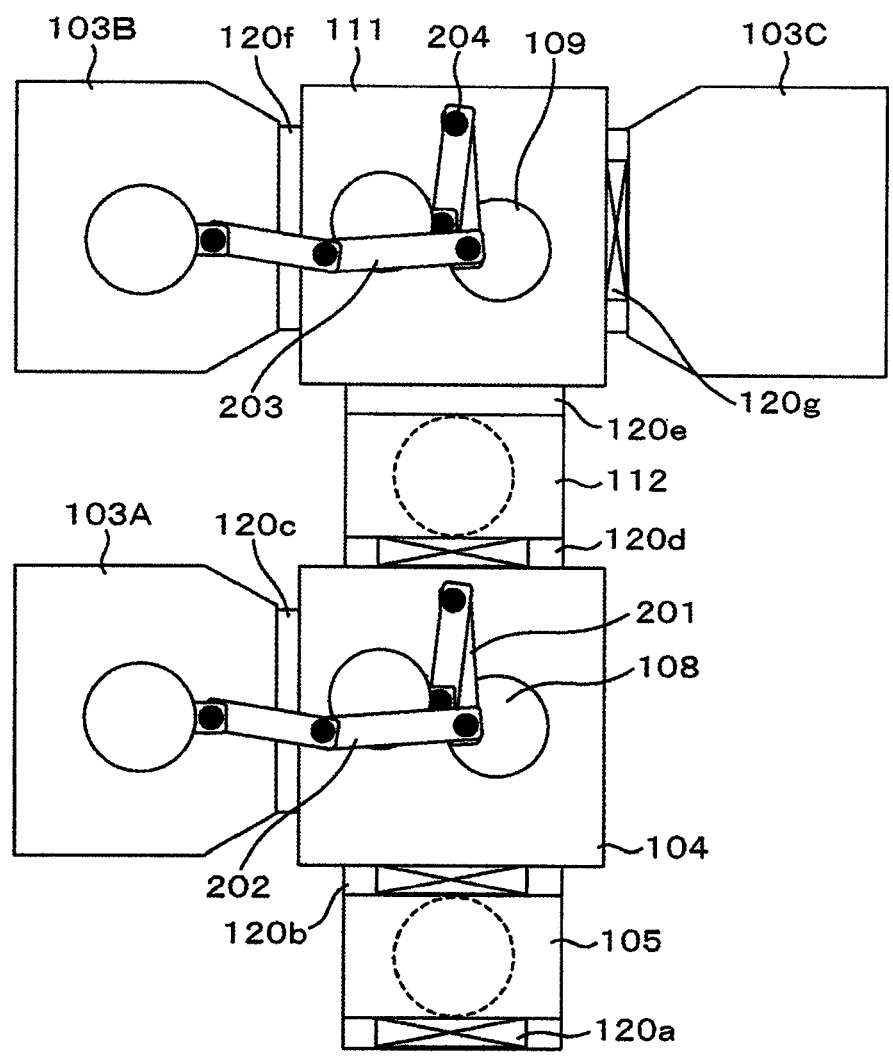
FIG. 4 is a cross-sectional view for indicating the vacuum transfer chambers of the embodiment shown in FIG. 1 in the enlarging manner.

Next, a detailed description is made of transferring and processing operations of wafers by the above-described vacuum processing apparatus 100 with reference to FIG. 2 to FIG. 4. FIG. 2 is an enlarged view for schematically showing an outline of a structure of the vacuum-side block of the embodiment shown in FIG. 1. More specifically, it is a diagram for representing in an enlarging manner part of the first vacuum transfer chamber 104 and the second vacuum transfer chamber 111 along with the vacuum process units 103A to 103C, the lock chamber 105, and the vacuum transfer intermediate chamber 112, which are coupled to circumferences of the vacuum transfer chambers, while the structure of the atmosphere-side block 101 is omitted.

The first vacuum transfer robot 108 is equipped with a first arm 201 and a second arm 202, which are constructed by employing a plurality of small arms for mounting a wafer on an upper plane of a mounting portion of a tip portion thereof so as to transfer the mounted wafer, and a plurality of joint portions which couple these small arms to each other so as to drive the small arms. Although a total number of these arms is 2 in the present embodiment, 3 or 4 arms may be alternatively employed. The first and second arms 201 and 202 of the first vacuum transfer robot 108 are equipped with structures capable of simultaneously performing operations along rotation directions as to upper/lower directions and along upper/lower height directions in the same directions and capable of independently performing contracting/extending operations of the respective arms by driving the above-described plurality of joint portions in different manners.

Also, with respect to contracting/extending operations of the arms, after one arm thereof is extended, the arm starts a contracting operation, and at the same time, the other arm thereof can perform an extending operation. Also, these two arms can perform the above-described operations as to the same direction. With employment of such a structure, in such a case that an unprocessed wafer has been held by any one arm thereof, the first and second vacuum transfer robots 108 and 109 shown in FIG. 2 can replace a processed wafer held in any one of transfer destinations by the unprocessed wafer held by the vacuum transfer robot 108 or 109 while suppressing that the first or second vacuum transfer robot 108 or 109 is rotated around the axis of the base portion, so that transfer efficiencies and capabilities of the wafers are increased.

Referring to FIG. 2 through FIG. 4, a description is made of operations of the vacuum processing apparatus 100, more specifically, operations of the vacuum-side block 102, when an unprocessed wafer is transferred from the lock chamber 105 via either the first vacuum transfer chamber 104 or the vacuum transfer intermediate chamber 112 and the second vacuum transfer chamber 111 to any one of the vacuum process units 103A to 103C coupled thereto, this transferred unprocessed wafer is processed, and thereafter, the processed wafer is transferred back to the lock chamber 105. Also, in this operation, a vacuum process unit coupled to the first vacuum transfer chamber 104 will be referred to as a "vacuum processing chamber A"; a vacuum process unit which is connected to the second vacuum transfer chamber 111 and is coupled to the second vacuum transfer chamber 111 at a position where the vacuum process chamber A is offset from the lock chamber along a depth direction will be referred to as a "vacuum processing chamber B"; and a vacuum process unit coupled to a side wall of the second vacuum transfer chamber 111, which corresponds to one plane located at a plane facing with respect to the vacuum process chamber B, will be referred to as a "vacuum processing chamber C."

It should be noted that in the present embodiment, the valves for opening/closing the gates which communicate the spaces between the respective vacuum process units and the transfer chambers within the vacuum transfer chambers are exclusively operated in response to the instructions from the control unit. In particular, as to a plurality of vacuum process units coupled to the same vacuum transfer chamber, valves are controlled in such a manner that when a valve related to one vacuum process unit is under open condition, valves related to other vacuum process units are closed, so that other vacuum process units are airtightly sealed. It should also be noted that when symbol "X" is indicated to the valves 120a to 120g, these drawings represent that the valves are under closing conditions whereas when no symbol is indicated thereto the relevant valve is under opening condition and thus the gate is opened, so that either spaces or chambers on both sides of this gate are communicated to each other.

FIG. 2 shows such a situation that under the condition that an unprocessed wafer is disposed within the lock chamber 105 the first vacuum transfer robot 108 in the first vacuum transfer chamber 104 extends the first arm 201 and enters the tip portion thereof into the lock chamber 105 so as to deliver the wafer with the holding portion disposed therein. On the other hand, in the second vacuum transfer chamber 111, the second vacuum transfer robot 109 extends the first arm 203 and enters the tip portion thereof into the vacuum process unit 103B so as to deliver a wafer in the processing chamber therein.

In FIG. 2, between the first and second vacuum transfer chambers 104 and 111, the valve 120d disposed at the front end portion of the vacuum transfer intermediate chamber 112 disposed therebetween along the forward/backward directions (upper/lower directions viewed on the drawing) airtightly seals the gate for communicating the vacuum transfer intermediate chamber 112 to the first vacuum transfer chamber 104. Under such a condition, the first vacuum transfer chamber 104 located under the valve 120d is airtightly sectioned with respect to the second vacuum transfer chamber 111 located above the valve 120d, as viewed on the drawing. In particular, under the condition that the valve 120d is closed, other valves 120b, 102c, 120f, 120g are closed, which open/close the gates between the vacuum process units 103A to 103C coupled to the first and second vacuum transfer chambers 104 and 111 and the lock chamber 105, so that these two vacuum transfer chambers are airtightly sealed under vacuum condition, and are airtightly sectioned from the vacuum process units 103A to 103C, the lock chamber 105, and other vacuum transfer chambers.

In the present embodiment, by maintaining the condition that the valve 102d is closed, processes and operations with respect to the vacuum process unit 103A and any one of the vacuum process units 103B and 103C are independently performed and influence of the opening/closing operation of the gate between the coupled first and second vacuum transfer chambers 104 and 111 by the other operation is suppressed. In this drawing, for example, under such a condition that two blocks are airtightly sectioned by the valve 120d between the first and second vacuum transfer chambers 104 and 111, although the valve 120f is opened which opens/closes the gate between the vacuum process unit 103B and the second vacuum transfer chamber 111 of the present embodiment, the valve 120g between the vacuum process unit 103C coupled to the same vacuum transfer chamber and the second vacuum transfer chamber 111 is closed.

Under the above-explained condition, only the second vacuum transfer chamber 111 and the processing chamber within the vacuum process unit 103B are communicated to each other. In the present embodiment, the pressure within the first and second vacuum transfer chambers 104 and 111 and the pressure within the processing chambers of the vacuum process units 103A to 103C are controlled in response to an instruction of the control unit in such a manner that the former-mentioned pressure become higher than the latter-mentioned pressure before at least one of the valves 102c, 120f, 120g is opened which opens/closes the gates for communicating these vacuum process units. In other words, in the present embodiment, as exhausting apparatuses for exhausting the inside of the processing chambers within the vacuum process units 103A to 103C a turbo-molecular pump and a roughing vacuum pump such as a rotary pump disposed on the downstream side of the exhaust flow of this turbo-molecular pump are communicated to the processing chambers and are coupled thereto. On the other hand, entrances of the roughing vacuum pumps are arranged by being communicated to the first and second vacuum transfer chambers 104 and 111. It is so constructed that the insides of the processing chambers can be exhausted and decompressed by operations of the turbo-molecular pump down to pressure which is further lower than that by the roughing vacuum pump (high degree of vacuum).

Also, the valves 120b, 120c, 120f, and 120g disposed around the first and second vacuum chambers 104 and 111 are controlled in such a manner that under the condition that the inner space between the first and second vacuum chambers 104 and 111 is airtightly sectioned under closed states of the valves 102d and 120e of the vacuum transfer intermediate chamber 112, only one of the valves arranged around the respective transfer chambers in each of the sectioned blocks is opened in response to an instruction of the control unit. As a result, when any one of the above-described valves 120c, 120f, 120g is opened, gasses and particles present in the vacuum transfer chambers 104 and 111 move to the processing chambers in the vacuum processing units A to C communicated thereto, and conversely, it is suppressed that the gasses and the particles move from the processing chambers to the first and second vacuum transfer chambers 104 and 111.

For instance, in FIG. 2, while the valve 120*d* is closed, the valve 120*b* between the first vacuum transfer chamber 104 and the lock chamber 105 coupled thereto is opened, and the first vacuum transfer robot 108 is driven, so that the wafer is delivered between the lock chamber 105 and the robot. Also, under this situation, the valve 120*f* between the second vacuum transfer chamber 111 and the vacuum process unit 103B coupled thereto is opened, and the second vacuum transfer robot 109 is driven, so that the wafer is delivered between the internal processing chamber and the robot. More specifically, the second vacuum transfer robot 109 mounts the wafers on the first arm 203 and the second arm 204 respectively and executes a replacing operation between the processed wafer and the unprocessed wafer.

In the present drawing, a route is shown in which the unprocessed wafer is transferred out from the lock chamber 105, and then, is transferred into the vacuum process unit 103A or 103B. In this route, after a detection is made of such a situation that the valves 120*b* to 120*d* positioned around the first vacuum transfer chamber 104 is closed while the unprocessed wafer is stored in the lock chamber 105, the control unit issues an instruction so as to open the valve 120*b*.

Moreover, the operation of the first vacuum transfer robot 108 is controlled, a wafer is received on the first arm 201 and transferred into the transfer chamber, and thereafter, the valve 120*b* is airtightly closed. Subsequently, in response to any one of the vacuum process units 103A and 103B as a target, an arm is rotated around the axis of the base portion so as to be opposed to other valves 120*c* and 120*d*.

In the case that the target is the vacuum process unit 103A, the arm is rotated to a predetermined position directed to the valve 120*c* and is stopped, and thereafter, the valve 120*c* is opened and the wafer is transferred into the processing chamber of the relevant process unit. It should also be understood that, when a processed wafer is present in the processing chamber within the process unit, the second arm is firstly driven to transfer out the processed wafer from the processing chamber, an unprocessed wafer is transferred into the processing chamber, and the unprocessed wafer is delivered between the arm and a sample stage within the processing chamber. As previously described, in the present embodiment, the first and second arms 201 and 202, or 203 and 204 are constructed in such a manner that contracting/extending operations for transferring into/out a wafer with respect to an arbitrary target can be simultaneously carried out.

On the other hand, in the case that the target is the vacuum process unit 103B, the first vacuum transfer robot 108 rotates a wafer on the arm to a predetermined position directed to the valve 120*d* and stops, and then, the valve 120*d* is opened so as to communicate the first vacuum transfer chamber 104 and the vacuum transfer intermediate chamber 112. At this time, the control unit detects the propriety of closing the valves 120*e* to 120*g* in a previously sectioned block on the side of the second vacuum transfer chamber 111.

When a detection is made that the valves 120*f* and 120*g* between the vacuum process units 103B and 103C have been closed or ,while the wafer is transferred into the vacuum transfer intermediate chamber 112 by the first vacuum transfer robot 108, the processes in the above-described respective processing units are not accomplished or closing of the valves 120*f* and 120*g* can be maintained, since the valves 120*b* and 120*c* in the block on the side of the first vacuum transfer chamber 104 are closed, the inner spaces of the first and second vacuum transfer chambers 104 and 111, and the vacuum transfer intermediate chamber 112 are communicated to each other, so that the communicated inner spaces can be formed as a single airtightly-sealed section. Then, the valve 120*d* is opened in combination with the valve 120*e* opening state can be maintained while the wafer is transferred into the vacuum transfer intermediate chamber 112.

When such a time instant is expected that the processes of the vacuum process units 103B and 103C are accomplished while the unprocessed wafer is transferred into the vacuum transfer intermediate chamber 112 by the first vacuum transfer robot 108 and at least one of the valves 120*f* and 120*g* can be opened, by closing the valve 120*e*, the control unit sections the inside of the vacuum-side block 102 between the first and second vacuum transfer chambers 104 and 111. Since the valve 120*e* is airtightly closed, even if the valve 120*d* is opened, it is suppressed that the gas between the sectioned blocks gives an effect from one sectioned block to the other sectioned block, so that it is reduced that an influence is given to the processes of the respective processing units.

As a result, production of contaminating matters and generation of contamination of the wafer can by suppressed, which happen due to mutual effects between the respective process units or the sectioned blocks. More specifically, in the case that in the vacuum process units 103A to 103C coupled to the first and second vacuum transfer chambers 104 and 111 processing conditions are different from each other or film structures having different film sorts are processed at the same time, there is a risk that produced matters, remaining matters, and gases of one process may give influences to a wafer subject to the other process, namely so-called "cross contamination" may occur, so that processing yields and processing efficiencies are lowered. With employment of the above-described construction, an occurrence of such a problem is reduced.

Under the condition that the valve 120*e* is closed, the valve 120*d* is opened to transfer an unprocessed wafer to a place of the upper holding unit within the vacuum transfer intermediate chamber 112 so as to be delivered. At this time, although the gasses and the particles present in the vacuum transfer intermediate chamber 112 may flow into the first vacuum transfer chamber 104, since the gates of the outer circumstance of this vacuum transfer chamber are closed by the valves 120*b* and 120*c*, influences given to the other vacuum process unit 103A and the lock chamber 105 caused by the flow may be suppressed. At this time, in the case that a processed wafer is stored at the upper position of the holding unit within the vacuum transfer intermediate chamber 112, after the processed wafer is transferred out by the second arm 202, the unprocessed wafer can be stored in this vacuum transfer intermediate chamber by operating the first arm.

Further, the first arm 201 of the first vacuum transfer robot 108 is contracted to leave from the vacuum transfer intermediate chamber 112. Then, the valve 120*d* is closed in response to an instruction from the control unit. Thereafter, when a detection is made that the valves 120*f* and 120*g* for opening/closing the gates around the second vacuum transfer chamber are closed, the control unit opens the valve 120*e* under the condition that closing of these valves is maintained. At this time, the space within the vacuum transfer intermediate chamber 112 is communicated to the inner space of the second vacuum transfer chamber 111.

Under the above-described condition, a backward space airtightly sectioned from the forward-sided block of the vacuum-side block 102 is constructed by the valve 120*d*. Under such a situation that the valves 120*d* and 120*e* are closed, in the case that an opening for exhausting the inside is provided and the inside is not exhausted through this opening while these valves are closed, pressure inside becomes similar to or higher than pressure obtained before at least one of these valves is closed. As a result, by opening the valve 120e, a flow directed from the vacuum transfer intermediate chamber 112 to the second vacuum transfer chamber 111 is produced. At this time, since the valves 120f and 120g around the second vacuum transfer chamber 111 are closed, an influence can be contained only to the inside of the second vacuum transfer chamber 111. Also, when the valve 120f is opened, the unprocessed wafer is transferred out, and is replaced by the processed wafer in the vacuum process unit 103B by operating the second vacuum transfer robot 109 without opening/closing the valve 120e.

On the other hand, in such a case that wafers on the top surface of which film structures having the same sort have been provided thereof are processed in the vacuum process units 103A to 103C under equivalent process conditions, it is possible to judge that lower influences caused by produced matters and residual gasses which are generated by a process executed in any one of the process units are given to other process units. In this case, the closing situations of the valves 120b, 120c, 120f, and 120g are maintained under a condition that the valves 120d and 120e of the above-described vacuum transfer intermediate chamber 112 are opened.

In other words, the inner spaces defined by combining the first and second vacuum transfer chambers 104 and 111 with the vacuum transfer intermediate chamber 112 are sectioned as a single space, or a single chamber, the outer circumstance of which is airtightly sealed by the above-explained valves 120b, 120c, 120f, and 120g. That is, in such a case that the valves 120d and 120e provided between the vacuum transfer intermediate chamber 112 and the first and second vacuum transfer chambers 104 and 111 coupled thereto are brought into open statuses and a valve for any one of the plural vacuum process units 103A to 103C provided on the side of the vacuum-side block 102 is opened to transfer out toward the lock chamber 105, by controlling the valves 120d and 120e disposed in the front/rear end portions of the vacuum transfer intermediate chamber 112 to be brought into open statuses, after the processed wafer in the vacuum processing unit B is transferred out by the second vacuum transfer robot 109, it is quickly transferred into the intermediate chamber and can be replaced by the unprocessed wafer transferred thereinto by the first vacuum transfer robot 108, so that the transferring efficiency is improved.

FIG. 3 is a diagram for schematically showing a situation under which in the vacuum processing apparatus of the present embodiment shown in FIG. 1 the valves 120d and 120e for opening/closing the gates are opened, which are disposed by being coupled to upper and lower end portions (as viewed on the drawing) of the vacuum transfer intermediate chamber 112 and communicate the first and second vacuum transfer chambers 104 and 111. More specifically, it shows a situation under which in the vacuum-side block 102 of the above-described vacuum processing apparatus 100 the first arm 201 of the first vacuum transfer robot 108 is extended and transfers a wafer into the vacuum transfer intermediate chamber 112 while the second vacuum transfer robot 109 extends the first arm 203 and transfers out another wafer from the vacuum transfer intermediate chamber 112.

In this drawing, the first arm 201 of the first vacuum transfer robot 108 and the first arm 203 of the second vacuum transfer robot 109 deliver the wafers with respect to holding portions of the holding units installed at positions having different heights. As previously described, the valves 120b, 120c, 120f, and 120g are closed which are positioned at the outer circumferences of the first and second vacuum transfer chambers 104 and 111 and open/close the spaces between the inner spaces and the vacuum process units 103A to 103C and the lock chamber 105 while the valves 120d and 120e are opened which are opened/closed at the front/back end portions of the vacuum transfer intermediate chamber 112, so that a single section constructed by coupling the two first/second vacuum transfer chambers is airtightly held.

In FIG. 3, in response to an instruction from the control unit, sealing situations as to any of the vacuum process units 103A, 103B, and 103C are held by the respective valves 120b, 120c, 120f, and 120g between the first and second vacuum transfer chambers 104 and 111, to which the respective process units are coupled, so that the valves provided between both ends of the vacuum transfer intermediate chamber 112 and the vacuum transfer chambers coupled thereto are maintained under open conditions. In other words, in such a case that the valves provided between the plurality of vacuum process units 103A to 103C provided on the side of the vacuum-side block 102 and the transfer chambers coupled to them so that any of these process units are sealed, the valves 120d and 120e provided between the vacuum transfer intermediate chamber 112 and the transfer chambers coupled thereto are held under open conditions. Then, when a wafer is delivered between one transfer chamber and the other transfer chamber, opening/closing of the valves disposed in both ends of an intermediate chamber equipped with a holding unit are suppressed, so that time required for transferring the wafer is reduced, and thus, an entire processing efficiency is improved.

It should be noted that when either the control unit or the host computer expects that while the above-described wafer is delivered between the first and second vacuum transfer chambers via the wafer holding unit of the vacuum transfer intermediate chamber 112 the process in any one of the vacuum process units 103A to 103C is accomplished so that the valves 120c, 120f, and 120g between these and the transfer chambers are brought into conditions able to open, or the lock chamber 105 into which an unprocessed wafer is stored is exhausted and the decompression thereof down to predetermined pressure is accomplished so that the valve 120b is brought into a condition able to open, at least one of the valves 120d and 120e provided in the front/back ends of the vacuum transfer intermediate chamber 112 is closed in response to an instruction from the control unit or the host computer. In the present embodiment, the valve 120d is closed, and if necessary, the valve 120e is closed.

For instance, when the control unit judges that the process of the vacuum process unit 103A is accomplished so that the valve 120c is able to open, the control unit stores an unprocessed wafer into the vacuum transfer intermediate chamber 112 and thereafter closes the valves 120d so as to airtightly section the front/rear spaces of the vacuum-side block 112 at the position of this valve. Thereafter, in response to an instruction from the control unit, the valve 120c is opened, the processed wafer within the vacuum process unit 103A is transferred out by one of the arms of the first vacuum transfer robot 108 and, then, the valve 120c is closed. At this time, if an unprocessed wafer which should be processed by the vacuum process unit 103A is present on the other arm thereof, this unprocessed wafer may be alternatively replaced by the above-described processed wafer.

While the above-described operation is carried out in the block of the sectioned space portioned on the forward side of the vacuum processing apparatus 100, the transfer operation by the second vacuum transfer robot 109 can be carried out at the same time in the backward sectioned space containing the second vacuum transfer chamber 111. In other words, a wafer processed in any one of the vacuum process units 103B and 103C can be transferred out therefrom, and an unprocessed wafer can be replaced by the processed wafer.

A wafer stored in the vacuum transfer intermediate chamber 112 is disposed in the airtightly sectioned backward block containing the second vacuum transfer chamber 111 and sectioned by the valve 120*d* and is brought into such a waiting condition that the wafer will be transferred out to the target vacuum process units 103B and 103C or the front-side first vacuum transfer chamber 104. Even when the valves 120*f* and 120*g* are opened while the processed wafer is stored in the vacuum transfer intermediate chamber 112 and has been brought into the waiting condition, as previously described, since the vacuum transfer intermediate chamber 112, the second vacuum transfer chamber 111, and the processing chamber in the vacuum process unit 103B, or 103C have been constructed to form differences in pressure, a generation of contaminating matters is suppressed.

FIG. 4 is a diagram for schematically showing a situation where the side of the first vacuum transfer chamber 104 and the side of the second vacuum transfer chamber 111 are closed either in front of or after the vacuum transfer intermediate chamber 112 and are airtightly sectioned as respective blocks and wafers are transferred with respect to the vacuum process units 103A and 103B for each of the blocks. In this drawing, such a situation is indicated that the first vacuum transfer robot 108 extends the first arm 201 so as to transfer a wafer into the vacuum process unit 103A and the second vacuum transfer robot 109 extends the first arm 203 so as to transfer a wafer into the vacuum process unit 103B.

As shown in this drawing, both the vacuum process unit 103A and the vacuum process unit 103B are controlled in such a manner that under the condition that the valves 120*c* and 120*f* between the transfer chambers coupled thereto are opened and the valve 120*d* provided between the vacuum transfer intermediate chamber 112 and the first vacuum transfer chamber 104 is kept under closed condition. That is, in the case that inner spaces of process units coupled to different transfer chambers which are coupled with each other by sandwiching the vacuum transfer intermediate chamber 112 are coupled to inner spaces of the transfer chambers and a wafer is transferred in the relevant process unit, any one of valves is controlled under closed condition, which are disposed at both end positions of the intermediate chamber coupled between the transfer chambers to which the respective process units are connected.

More specifically, in the present embodiment, the valve 120*d* between the first vacuum transfer chamber 104 of the front side and the vacuum transfer intermediate chamber 112 is maintained under closed condition. Under the above-described condition, opening of the valve 120*e* is kept, and in the sectioned block of the back side, the valve 120*f* between the vacuum process unit 103B and the second vacuum transfer chamber 111 is opened. Thereafter, the control unit transmits such an instruction that the second arm 204 of the second vacuum transfer robot 109 is entered into the inner processing chamber so as to receive a processed wafer on this arm, and thereafter, the arm is contracted and left from the processing chamber so as to transfer out the wafer.

Thereafter, in response to an instruction from the control unit, the second vacuum transfer robot 109 enters the tip portion of the first arm 203, on which an unprocessed wafer is mounted, into the processing chamber within the vacuum process unit 103B in order to deliver this unprocessed wafer to a sample stage provided in the processing chamber thereof, and thereafter, contracts the arm so as to leave from the chamber. In addition, the second vacuum transfer robot 109 is rotated around the base portion so as to face the tip portion of the second arm 204, on which the processed wafer is mounted, to the vacuum transfer intermediate chamber 112 and extends the second arm 204 to transfer the wafer into the lower holding unit within the vacuum transfer intermediate chamber 112 to deliver. Under a condition that the valve 120*d* is closed, the processed wafer waits in the vacuum transfer intermediate chamber 112 for being transferred into the first vacuum transfer chamber 104.

During this waiting condition, the first vacuum transfer robot 108 in the first vacuum transfer chamber 104 performs such a transfer-in operation at the same time that the first arm 201 is extended so as to transfer an unprocessed wafer held on the tip portion thereof into the processing chamber within the vacuum process unit 103A and this unprocessed wafer is delivered to the upper surface of the sample stage within the processing chamber. After the first arm 201 is contracted to leave from the processing chamber, the valve 120*c* is closed and the inside of the first vacuum transfer chamber 104 is airtightly sectioned by closing the valves 120*b* and 120*c* disposed around the chamber.

When the control unit detects that the decompression of the inside of the lock chamber 105 is accomplished and the valve 120*b* is able to open, the first vacuum transfer robot 108 is rotary-driven around the base portion so as to position the second arm 202 facing to the lock chamber 105. Next, the valve 120*b* is opened and the second arm 202 is extension-driven so that the processed wafer is transferred into the lock chamber 105. When a detection is made that the second arm 202 leaves, the valve 120*b* is closed so that increasing of the pressure inside the lock chamber 105 is commenced in order to transfer out to the atmospheric side.

In the case that the control unit judges that the processed wafer can be transferred out from the vacuum transfer intermediate chamber 112 to the first vacuum transfer chamber 104 based upon the process operation of the vacuum process unit 103A and scheduling information of decompression steps of the lock chamber 105, for example, if the control unit judges that the above-described process operation and an ending time of the decompression are not reached before a completion of the transfer-out operation, closing of the valve 120*e* is instructed and performed.

As a result, opening of the valve 120*d* is carried out under such conditions that the inside of the vacuum transfer intermediate chamber 112 is brought into an airtightly sectioned situation in the front/rear sides thereof and closing of the valve 120*e* and the valves 120*b*, 120*c* is maintained. Although the gas contained in the vacuum transfer intermediate chamber 112 flows into the first vacuum transfer chamber 104 when the valve 120*d* is opened, since the valves 120*b* and 120*c* are closed, their influences to the inner space or the wafer inside are suppressed.

In response to an instruction from the control unit, the first vacuum transfer robot 108 is rotary-driven around the axis of the base portion and is stopped facing to the vacuum transfer intermediate chamber 112. Then, the second arm 202 is extension-driven so as to receive the processed wafer from the lower holding unit in the vacuum transfer intermediate chamber 112, and the second arm 202 is contract-driven so as to transfer out from the vacuum transfer intermediate chamber 112. When a detection is made that contracting of the second arm 202 is accomplished and transfer of the processed wafer from the vacuum transfer intermediate chamber 112 is accomplished, the valve 120*d* is closed so that the inside of the first vacuum transfer chamber 104 is airtightly sectioned.

Thereafter, when a detection is made of closing of the valves 120*f* and 120*g* around the second vacuum transfer chamber 111, while this valve closing condition is maintained, the valve 120e is opened. Under this condition, the vacuum-side block 102 is airtightly sectioned into a forward-side block and a back-side block by the valve 120d so that the wafer processing and transferring operations can be carried out at the same time in the respective sectioned regions.

As previously described, in the present embodiment, when a wafer is transferred via the vacuum transfer intermediate chamber 112 between the first and second vacuum transfer chambers 104 and 111 which are coupled with each other by sandwiching the vacuum transfer intermediate chamber 112, as to the valves 120d and 120e disposed at the front and rear end portions thereof, which open/close the gates, the wafer is moved from the vacuum transfer chamber of one side to the vacuum transfer chamber of the other side by transferring the wafer into the vacuum transfer intermediate chamber 112 while one of the valves 120d and 120e is maintained as closed and the other as opened, closing the other valve, and thereafter opening the one to transfer the wafer out. Also, in the case that a wafer is transferred from the sectioned region of the forward side to the sectioned region of the back side, after the valve 120e of the back side is once closed under a condition that the valve 120d of the forward side is closed, the valve 120d of the forward side is opened so as to transfer the wafer from the region of the forward side into the vacuum transfer intermediate chamber 112. Subsequently, after the valve 120d of the forward side is closed, the valve 120e of the back side is opened and the wafer is transferred out to the sectioned region of the back side, so that the wafer is transferred.

Also, these operations are carried out under such a condition that closing of the valves 120b, 120c, 120f, and 120g is maintained between the vacuum process units 103A to 103C and the lock chamber 105, which are disposed on the outer circumferential sides of the first and second vacuum transfer chambers 104 and 111. Also, in the case that wafers having the same sort of film structures are processed under equivalent process conditions in the respective processing chambers within the vacuum process units A to C, under such a condition that closing of these valves is maintained, open conditions of the valves 120d and 120e disposed at the front/rear end portions of the vacuum transfer intermediate chamber 112 are maintained at the same time and the first and second vacuum transfer chambers 104 and 111 and the vacuum transfer intermediate chamber 112 are coupled to each other and are maintained as an airtightly-sectioned region so that the wafers may be alternatively transferred among these.

In the above-described embodiment, it is possible to suppress that an atmosphere such as process gasses produced in connection with a process performed in a processing chamber within any one of the plural vacuum process units 103A to 103C is contacted to atmospheres and inner members of other vacuum process units, or is contacted to either process-scheduled wafers or processed wafers in these other vacuum process units, so that generations of contaminating matters and contamination of wafers can be suppressed. Also, maintenance/checking times and frequencies of the vacuum-side block such as the respective vacuum process units, the vacuum transfer chambers, and the vacuum transfer intermediate chamber can be reduced, so that the processing efficiencies can be improved. Also, the time required for transferring the wafers can be reduced and the processing efficiencies can be improved.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A vacuum processing apparatus comprising:

first and second vacuum transfer vessels in which a wafer is transferred through inner decompressed space of first and second vacuum transfer chambers thereof;

first and second vacuum process vessels coupled to said first and second vacuum transfer vessels respectively, in which first and second processing chambers thereof for processing therein said both of plasma process conditions to process wafers are communicated to said first and second vacuum transfer chambers, and each of said first and second processing chambers being configured equivalent, such that wafer are processed under identical plasma processing conditions in each of the first and the second processing chambers;

an intermediate chamber vessel configured to store said wafer in a storing vessel therein, the intermediate chamber vessel being disposed between said first and second vacuum transfer vessels, said first and second vacuum transfer vessels being coupled to each other only by said intermediate chamber vessel;

a lock chamber coupled to said first vacuum transfer vessel, an inner space of which is communicated with an inner space of said first vacuum transfer vessel;

first and second robots, said first robot being disposed inside said first vacuum transfer chamber and configured to transfer said wafer between said lock chamber and said first processing chamber or the storing chamber in said intermediate chamber vessel, and said second robot being disposed inside said second vacuum transfer chamber and configured to transfer said wafer between said second processing chamber and the storing chamber in said intermediate chamber vessel, each of said first and second robots having a plurality of arms capable of holding said wafer thereon and being contracted/extracted, and configured to transfer said wafer into a transfer destination of said wafer by using one of said plurality of arms after transferring another wafer located in said transfer destination of said wafer out therefrom by using another arm of said plurality of arms while holding said wafer on said one of said plurality of arms such that an unprocessed wafer and a processed wafer are exchanged at the same time, wherein said unprocessed wafer located inside said lock chamber is transferred to said first processing chamber along one path which is through said first vacuum transfer chamber and is processed in said first processing chamber, or is transferred to said second processing chamber along another path which is through said first vacuum transfer chamber, said intermediate chamber vessel, and said second vacuum transfer chamber, and is processed in said second processing chamber, and said wafer processed in said first or second processing chamber is transferred back to said lock chamber along said one path or said another path, and wherein said vacuum processing apparatus further comprises a plurality of valves disposed among said first and second vacuum transfer vessels, said first and second vacuum process vessels, said intermediate chamber vessel, and said lock chamber, respectively, for opening a communicating passage in which said wafer is transferred among said first/second vacuum transfer and process vessels, said intermediate chamber vessel, and said lock chamber, or for airtightly sealing said communicating passage to close said communicating passage after said wafer is transferred; and a control unit configured to control, using said first and second robots, transfer of said wafer between said first processing chamber and said lock chamber through said first vacuum transfer chamber, and transfer of said wafer between said second processing chamber and said lock chamber through both said first and second vacuum transfer chambers, to control opening and closing exclusively of only one of said plurality of valves for said first vacuum transfer chamber between the processing chamber of said first vacuum process vessel and the vacuum transfer chamber of said first vacuum transfer vessel to be opened or closed, and to control opening and closing exclusively of only one of said plurality of valves for said second vacuum transfer chamber between the processing chamber of said second vacuum process vessel and the vacuum transfer chamber of said second vacuum transfer vessel to be opened or closed, the exclusive opening and closing of said one of said plurality of valves for said first vacuum transfer chamber and the exclusive opening and closing of said one of said plurality of valves for said second vacuum transfer chamber being performed in parallel during transfer of wafers while any one of said plurality of valves disposed between said first and second vacuum transfer vessels is maintained closed, such that the valve for the first vacuum transfer chamber and the valve from the second vacuum transfer chamber are opened and none of the other valves of the plurality of valves is opened when any one or more wafers are being transferred between the first and second vacuum transfer chambers.

2. The vacuum processing apparatus as claimed in claim 1, wherein said plurality of valves includes valves provided between a storage chamber for storing said wafer within said intermediate chamber vessel and each of the vacuum transfer chambers of said first and second vacuum transfer vessels, respectively, and which open or close communications between said storage chamber and each of said vacuum transfer chambers, respectively, and wherein said control unit is configured to control one of said plurality of valves disposed between said first vacuum process vessel and said first vacuum transfer vessel to be opened or closed, or one of said plurality of valves disposed between said second vacuum process vessel and said second vacuum transfer vessel to be opened or closed, while two of said plurality of valves, which control access to said intermediate chamber vessel, are maintained closed.

3. The vacuum processing apparatus as claimed in claim 2, wherein said control unit is configured to control one of said plurality of valves disposed between said first vacuum transfer vessel and said intermediate chamber vessel, or one of said plurality of valves disposed between said second vacuum transfer vessel and said intermediate chamber vessel, each of said valves being airtightly closed before said one valve disposed between said first vacuum process vessel and said first vacuum transfer vessel is opened, or before said one valve disposed between said second vacuum process vessel and said second vacuum transfer vessel is opened, and after said one valve disposed between said first vacuum process vessel and said first vacuum transfer vessel is airtightly closed, or after said one valve disposed between said second vacuum process vessel and said second vacuum transfer vessel is airtightly closed.

4. The vacuum processing apparatus as claimed in claim 1, wherein said control unit is configured to control one of said plurality of valves disposed between said first vacuum transfer vessel and said intermediate chamber vessel, or one of said plurality of valves disposed between said second vacuum transfer vessel and said intermediate chamber vessel, each of said valves being airtightly closed before said one valve disposed between said first vacuum process vessel and said first vacuum transfer vessel is opened, or before said one valve disposed between said second vacuum process vessel and said second vacuum transfer vessel is opened, and after said one valve disposed between said first vacuum process vessel and said first vacuum transfer vessel is airtightly closed, or after said one valve disposed between said second vacuum process vessel and said second vacuum transfer vessel is airtightly closed.

\* \* \* \* \*